(12) United States Patent
Seo et al.

(10) Patent No.: US 11,657,964 B2
(45) Date of Patent: May 23, 2023

(54) MULTILAYER CAPACITOR AND BOARD HAVING THE SAME MOUNTED THEREON

(71) Applicant: SAMSUNG ELECTRO-MECHANICS CO., LTD., Suwon-si (KR)

(72) Inventors: Chun Hee Seo, Suwon-si (KR); Jong Suk Jeong, Suwon-si (KR); Jin Woo Kim, Suwon-si (KR); Tae Hyung Kim, Suwon-si (KR); Jeong Wook Seo, Suwon-si (KR); Dong Geon Yoo, Suwon-si (KR); Jong Hoon Yoo, Suwon-si (KR); Su Been Kim, Suwon-si (KR)

(73) Assignee: SAMSUNG ELECTRO-MECHANICS CO., LTD., Suwon-si (KR)

(*) Notice: Subject to any disclaimer, the term of this patent is extended or adjusted under 35 U.S.C. 154(b) by 0 days.

(21) Appl. No.: 17/549,004

(22) Filed: Dec. 13, 2021

(65) Prior Publication Data

US 2022/0199324 A1   Jun. 23, 2022

(30) Foreign Application Priority Data

Dec. 22, 2020 (KR) .......... 10-2020-0180613
Dec. 2, 2021 (KR) .......... 10-2021-0170635

(51) Int. Cl.
*H01G 2/00* (2006.01)
*H01G 4/30* (2006.01)
(Continued)

(52) U.S. Cl.
CPC .............. *H01G 2/00* (2013.01); *H01G 4/248* (2013.01); *H01G 4/30* (2013.01); *H05K 1/111* (2013.01);
(Continued)

(58) Field of Classification Search
CPC .......................................... H01G 2/00
(Continued)

(56) References Cited

U.S. PATENT DOCUMENTS

| 2016/0196918 A1* | 7/2016 | Hong | H01G 4/232 |
| | | | 361/301.4 |
| 2018/0130601 A1* | 5/2018 | Kim | H01G 4/33 |
| 2022/0177371 A1* | 6/2022 | Chung | C04B 35/64 |

FOREIGN PATENT DOCUMENTS

| KR | 10-2016-0084614 A | 7/2016 |
| KR | 10-2018-0051760 A | 5/2018 |

* cited by examiner

*Primary Examiner* — Stanley Tso
(74) *Attorney, Agent, or Firm* — Morgan, Lewis & Bockius LLP

(57) ABSTRACT

A multilayer capacitor includes a capacitor body including an active region having dielectric layers and internal electrodes alternately stacked therein, the capacitor body including upper and lower covers disposed on upper and lower surfaces of the active region, respectively; and an external electrode disposed on an external surface of the capacitor body. In one of the upper and lower covers, a portion thereof between a boundary surface of the active region and a boundary surface of the capacitor body is divided into a first cover region adjacent to the active region and a second cover region adjacent to the boundary surface of the capacitor body, and the first cover region includes grains having a core-shell structure doped with Sn. The first cover region includes 20% or more of Sn-doped core-shell structure grains, compared to the total of grains in the first cover region.

22 Claims, 11 Drawing Sheets

(51) Int. Cl.
*H05K 1/18* (2006.01)
*H05K 1/11* (2006.01)
*H01G 4/248* (2006.01)

(52) U.S. Cl.
CPC ... *H05K 1/181* (2013.01); *H05K 2201/10015* (2013.01)

(58) Field of Classification Search
USPC .......................................................... 174/260
See application file for complete search history.

I - I'

MULTILAYER CAPACITOR AND BOARD HAVING THE SAME MOUNTED THEREON

CROSS-REFERENCE TO RELATED APPLICATION(S)

This application claims benefit under 35 USC 119(a) of Korean Patent Application No. 10-2020-0180613 filed on Dec. 22, 2020 and Korean Patent Application No. 10-2021-0170635 filed on Dec. 2, 2021 in the Korean Intellectual Property Office, the entire disclosure of which is incorporated herein by reference for all purposes.

TECHNICAL FIELD

The present disclosure relates to a multilayer capacitor and a board having the same mounted thereon.

BACKGROUND

Recently, as electronic devices have been miniaturized, chip components are also being miniaturized, and multilayer capacitors are also required to be reduced in size and have greater capacitance and excellent reliability.

In detail, to secure reliability in an ultra-small multilayer capacitor, finer control is required in material selection and manufacturing.

Accordingly, due to the miniaturization of the multilayer capacitor and the thinning of the dielectric layer, the required material properties and sintering conditions are changing.

In detail, the reliability problem is emerging as an important issue due to the thinning of the dielectric layer, and also, as high temperature shortening of sintering conditions is applied, the surface diffusion of grains is lowered, and thus, it is important to secure the densification of the sintered body.

In addition, when the degree of densification of the cover portion of the capacitor body is reduced, moisture resistance characteristics may be deteriorated. Therefore, the need for technological development to address sintering behavior of the cover is increasing.

However, the current cover is formed by changing only the number of stacks of the same sheets, and has a shape in which the density of the outer portion is significantly lowered as compared to the interior of the cover.

Accordingly, there is a need for a method for improving and appropriately controlling the density of the cover exposed externally according to the characteristics of the chip, such as moisture resistance, toughness, and hardness.

SUMMARY

This summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

An aspect of the present disclosure is to provide a multilayer capacitor and a board having the same mounted thereon, in which properties such as moisture resistance, toughness, and hardness and densification of a cover may be secured at a certain level or more.

According to embodiments, a multilayer capacitor includes a capacitor body including an active region having dielectric layers and internal electrodes alternately stacked therein, the capacitor body including upper and lower covers disposed on upper and lower surfaces of the active region, respectively; and an external electrode disposed on an external surface of the capacitor body. In one of the upper and lower covers, a portion thereof between a boundary surface of the active region and a boundary surface of the capacitor body is divided into a first cover region adjacent to the active region and a second cover region adjacent to the boundary surface of the capacitor body, and the first cover region includes grains having a core-shell structure doped with Sn. The first cover region includes 20% or more of Sn-doped core-shell structure grains, compared to the total of grains in the first cover region.

In the grains of the core-shell structure doped with Sn, a ratio of Sn-doped portions in one grain is referred to as coverage, and the coverage may be 30% or more.

Grains included in the second cover region may not include Sn.

A size of grains of the second cover region may be greater than a size of grains of the first cover region.

A thickness of the first cover region may be 40 to 80% of a sum of thicknesses of the first cover region and the second cover region.

A grain size of the second cover region may be greater than a grain size of the first cover region, and a thickness of the first cover region may be 40 to 80% of a sum of thicknesses of the first cover region and the second cover region.

A grain size of the first cover region may be 100 to 180 nm.

A grain size of the second cover region may be 200 nm or more.

A grain size of the first cover region may be 100 to 180 nm, and a grain size of the second cover region may be 200 nm or more.

The grains of the first cover region may have a higher molar ratio of Ba/Ti than a molar ratio of grains of the active region.

A grain of the second cover region may be the same material as a material of a grain of the active region.

An average size of grains of the second cover region may be greater than an average grain size of grains of the first cover region.

An average grain size of the first cover region may be 100 to 180 nm.

An average grain size of the second cover region may be 200 nm or more.

An average grain size of the first cover region may be 100 to 180 nm, and an average grain size of the second cover region may be 200 nm or more.

According to embodiments, a board having a multilayer capacitor mounted thereon includes a substrate having a plurality of electrode pads disposed on an upper surface; and the multilayer capacitor installed on the substrate in such a manner that an external electrode is mounted on a pad. The multilayer capacitor includes a capacitor body including an active region having dielectric layers and internal electrodes alternately stacked therein, the capacitor body including upper and lower covers disposed on upper and lower surfaces of the active region, respectively; and an external electrode disposed on an external surface of the capacitor body. In the upper and lower covers, a portion thereof between a boundary surface of the active region and a boundary surface of the capacitor body includes two regions, and among two regions, a first cover region adjacent to the active region includes grains having a core-shell structure doped with Sn. The first cover region includes 20% or more of Sn-doped core-shell structure grains compared to the total of grains in the first cover region.

According to embodiments, a multilayer capacitor includes a capacitor body including an active region having dielectric layers and internal electrodes alternately stacked therein, the capacitor body including upper and lower covers disposed on upper and lower surfaces of the active region, respectively; and an external electrode disposed on an external surface of the capacitor body. One of the upper and lower covers includes a first region adjacent to the active region and a second region adjacent to the boundary surface of the capacitor body. The first region includes grains having a core-shell structure doped with more Sn than grains in the second region. An average size of the grains of the second region is greater than an average grain size of the grains of the first region.

The grains included in the second region may not include Sn.

The grains of the first region may have a higher molar ratio of Ba/Ti than a molar ratio of grains of the active region.

A grain of the second region may be the same material as a material of a grain of the active region.

An average grain size of the first region may be 100 to 180 nm, and an average grain size of the second region may be 200 nm or more.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Figure 1:
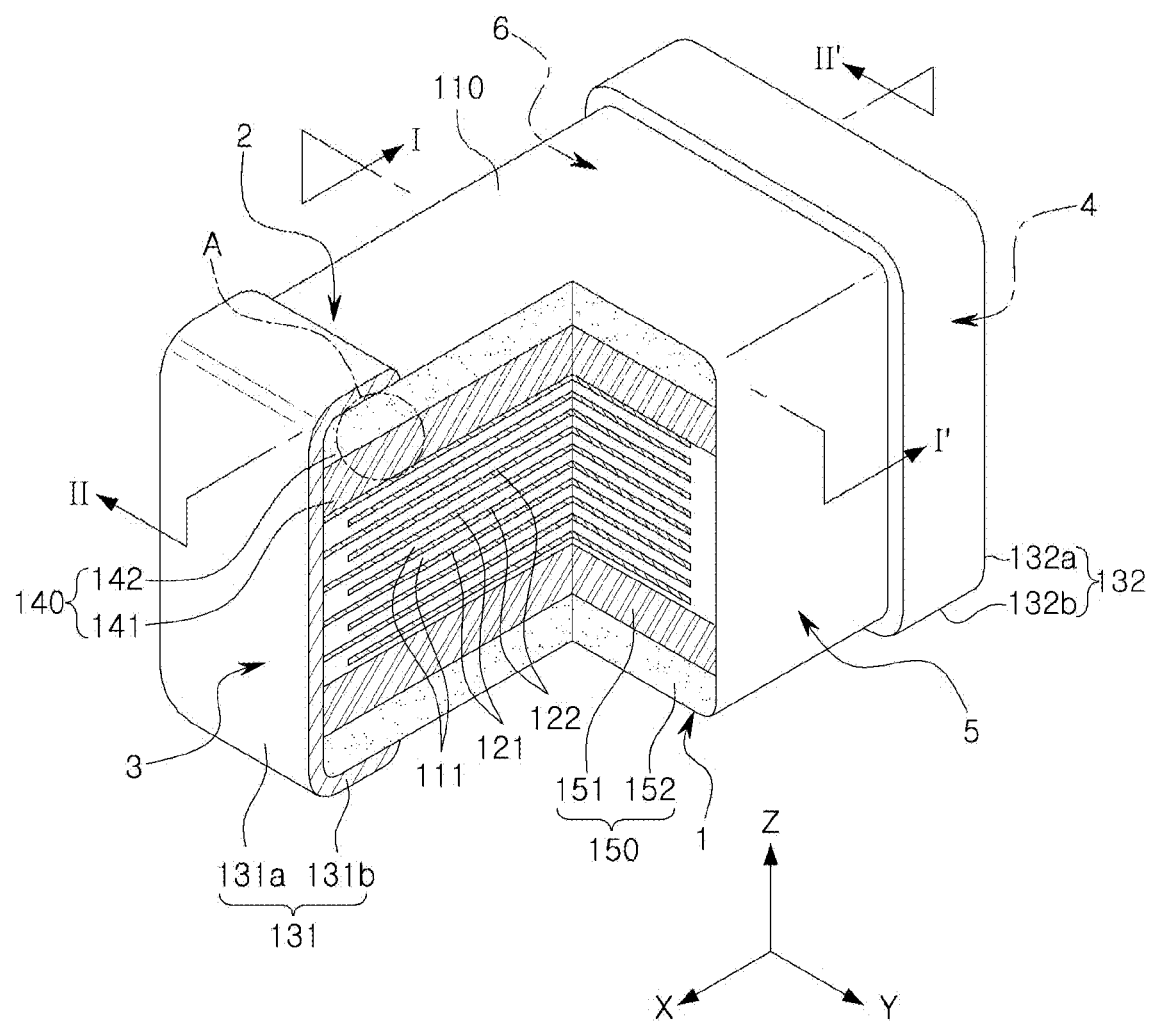
FIG. 1 is a perspective view schematically illustrating a portion of a multilayer capacitor according to an exemplary embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed, as will be apparent to one of ordinary skill in the art, with the exception of operations necessarily occurring in a certain order. Also, descriptions of functions and constructions that would be well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will fully convey the scope of the disclosure to one of ordinary skill in the art.

Herein, it is noted that use of the term "may" with respect to an embodiment or example, e.g., as to what an embodiment or example may include or implement, means that at least one embodiment or example exists in which such a feature is included or implemented while all examples and examples are not limited thereto.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term, "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has"

specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes illustrated in the drawings may occur. Thus, the examples described herein are not limited to the specific shapes illustrated in the drawings, but include changes in shape that occur during manufacturing.

The features of the examples described herein may be combined in various ways as will be apparent after gaining an understanding of the disclosure of this application. Further, although the examples described herein have a variety of configurations, other configurations are possible as will be apparent after an understanding of the disclosure of this application.

The drawings may not be to scale, and the relative sizes, proportions, and depiction of elements in the drawings may be exaggerated for clarity, illustration, and convenience.

Figure 2:
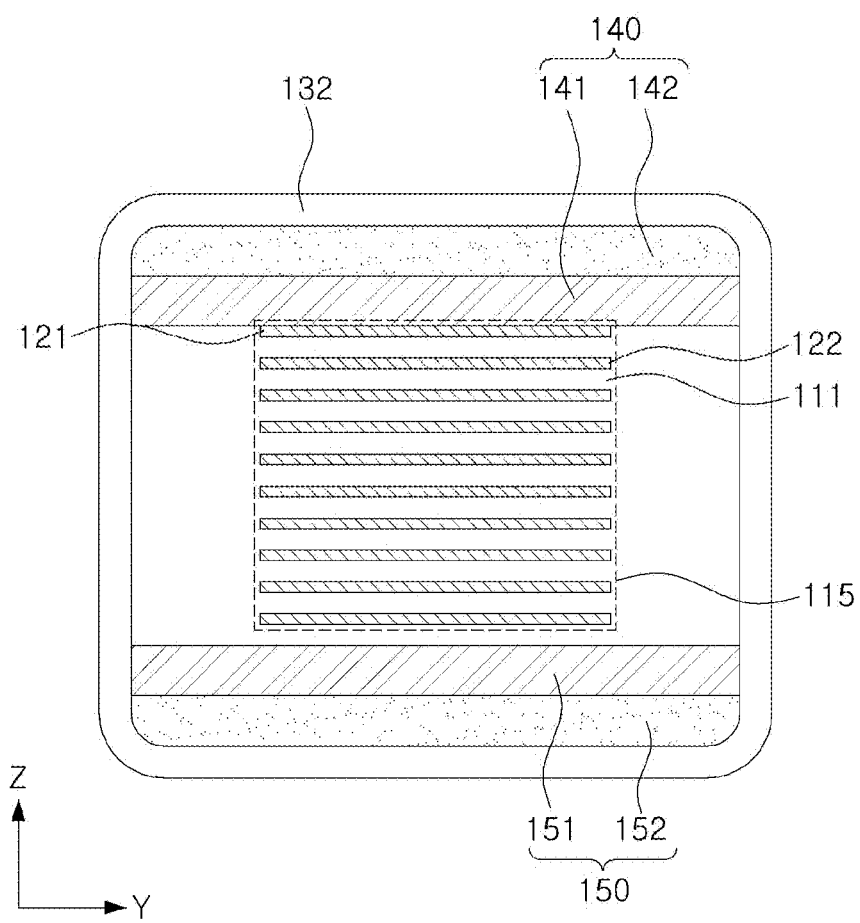
FIG. 2 is a cross-sectional view taken along line I-I' of FIG. 1.
Figure 3:
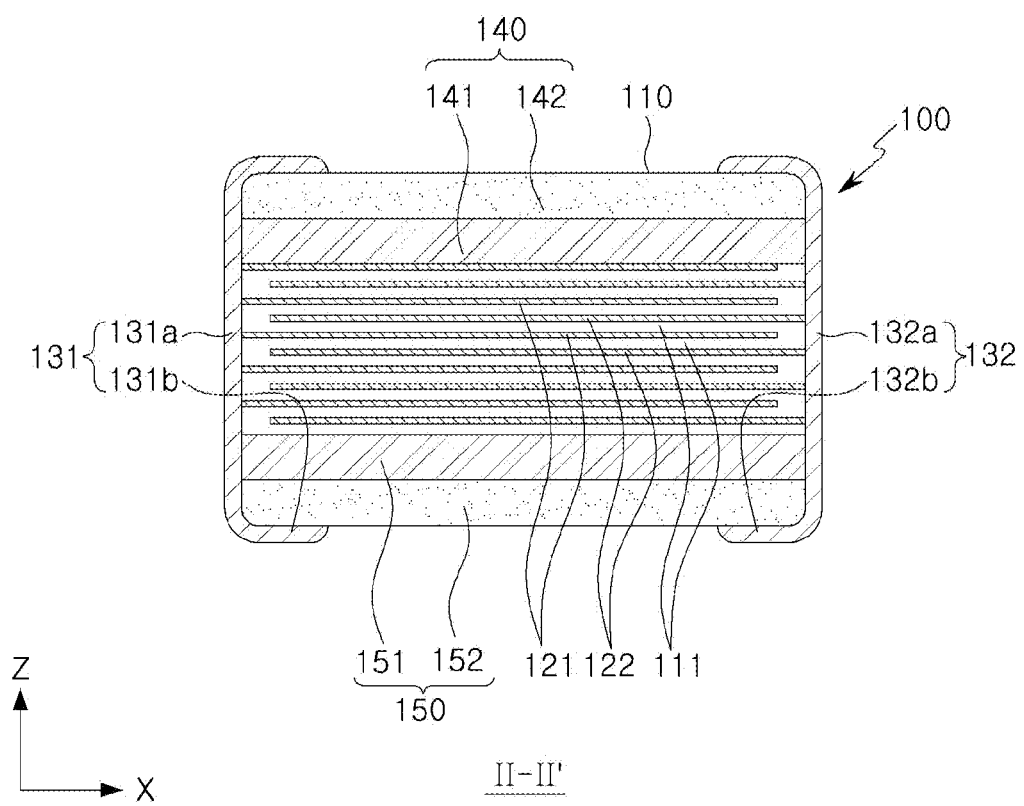
FIG. 3 is a cross-sectional view taken along line II-II' of FIG. 1.

FIG. 1 is a schematic perspective view illustrating a portion of a multilayer capacitor by cutting off the same according to an embodiment, FIG. 2 is a cross-sectional view taken along line I-I' of FIG. 1, and FIG. 3 is a cross-sectional view taken along line II-II' of FIG. 1.

Referring to FIGS. 1 to 3, a multilayer capacitor 100 according to an embodiment includes a capacitor body 110 and first and second external electrodes 131 and 132.

According to an embodiment, the Z direction illustrated in the drawing represents the thickness direction of the capacitor body 110, the X direction represents the longitudinal direction of the capacitor body 110, and the Y direction represents the width direction of the capacitor body 110.

In this case, the Z direction may indicate a stacking direction of internal electrodes and dielectric layers.

The capacitor body 110 may have first and second surfaces 1 and 2 opposing each other in the Z direction, third and fourth surfaces 3 and 4 opposing each other in the X direction, and fifth and sixth surfaces 5 and 6 opposing each other in the Y direction.

The shape of the capacitor body 110 is not particularly limited. For example, the capacitor body 110 may not have a perfectly straight hexahedral shape, but may have an approximate hexahedral shape.

The capacitor body 110 includes an active region 115, and upper and lower covers 140 and 150 disposed on and below the active region 115, respectively.

The active region 115 includes a plurality of dielectric layers 111 and a plurality of first and second internal electrodes 121 and 122.

According to an embodiment, the active region 115 may be formed by alternately stacking the first and second internal electrodes 121 and 122 and the dielectric layer 111 in the Z direction.

In the present embodiment, the upper and lower covers 140 and 150 are not separately distinguished from each other in the capacitor body unless otherwise indicated, and it may be understood that the upper and lower covers 140 and 150 are regions between the active region 115, and the second surface 2 and the first surface 1 of the capacitor body 110 opposing each other in the Z direction, respectively.

The dielectric layer 111 may include a ceramic material having a high dielectric constant, and may include, for example, a barium titanate ($BaTiO_3$)-based or strontium titanate ($SrTiO_3$)-based powder, but the material is not particularly limited as long as sufficient capacitance may be obtained.

In addition, a ceramic additive, an organic solvent, a plasticizer, a binder, and a dispersant may be further added to the dielectric layer 111, if necessary, together with the ceramic powder.

As the ceramic additive, a transition metal oxide or carbide, a rare earth element, magnesium (Mg), aluminum (Al), or the like may be used, but the present disclosure is not limited thereto.

In this case, the thickness of the dielectric layer 111 may be arbitrarily changed according to the capacitance design of the multilayer capacitor 100.

The first and second internal electrodes 121 and 122 may be alternately disposed with the dielectric layer 111 interposed therebetween, in the Z direction.

The first and second internal electrodes 121 and 122 may be electrically insulated from each other by the dielectric layer 111 disposed therebetween.

In addition, the first internal electrode 121 and the second internal electrode 122 are electrodes to which voltages of different polarities are applied, and for example, may be formed by printing a conductive paste including a conductive metal to a predetermined thickness on one surface of the dielectric layer 111.

The first internal electrode 121 may be exposed through (or be in contact with or extend from) the third surface 3 of the capacitor body 110, and the second internal electrode 122 may be exposed through (or be in contact with or extend from) the fourth surface 4 of the capacitor body 110.

The first and second internal electrodes 121 and 122 may be connected to the first and second external electrodes 131 and 132 through portions thereof exposed to the outer surface of the capacitor body 110, respectively.

Accordingly, when a voltage is applied to the first and second external electrodes 131 and 132, electric charges are accumulated between the first and second internal electrodes 121 and 122 facing each other, and in this case, the capacitance of the multilayer ceramic capacitor 100 is proportional to the area of the overlapping regions of the first and second internal electrodes 121 and 122 in the active region 115.

In addition, the conductive metal included in the conductive paste forming the first and second internal electrodes 121 and 122 may be nickel (Ni), copper (Cu), palladium (Pd) or alloys thereof, and the present disclosure is not limited thereto.

The first and second external electrodes 131 and 132 may be disposed on both ends of the capacitor body 110 in the X direction, to be connected to the first internal electrode 121 and the second internal electrode 122.

In this case, the first and second external electrodes 131 and 132 include a conductive layer formed on the third and fourth surfaces 3 and 4 of the capacitor body 110, and a plating layer formed on the conductive layer, if necessary.

The plating layer may include a nickel (Ni) plating layer formed on the conductive layer, and a tin (Sn) plating layer formed on the nickel (Ni) plating layer.

The first external electrode 131 may include a first connection portion 131a and a first band portion 131b.

The first connection portion 131a is a portion formed on the third surface 3 of the capacitor body 110 and connected to the exposed portion of the first internal electrode 121, and the first band portion 131b is a portion extending from the first connection portion 131a to a portion of the first surface 1 of the capacitor body 110.

In this case, the first band portion 131b may further extend to portions of the fifth and sixth surfaces 5 and 6 and a portion of the second surface 2 of the capacitor body 110 to improve fixing strength.

The second external electrode 132 may include a second connection portion 132a and a second band portion 132b.

The second connection portion 132a is formed on the fourth surface 4 of the capacitor body 110 and is connected to the exposed portion of the second internal electrode 122, and the second band portion 132b is a portion extending from the second connection portion 132a to a portion of the first surface 1 of the capacitor body 110.

In this case, the second band portion 132b may further extend to portions of the fifth and sixth surfaces 5 and 6 and a portion of the second surface 2 of the capacitor body 110 to improve fixing strength.

Referring to FIGS. 7 to 12, it can be seen that the grain size of a first cover region is smaller than that of the second cover region and the active region, and the density thereof is relatively high.

Figure 7:
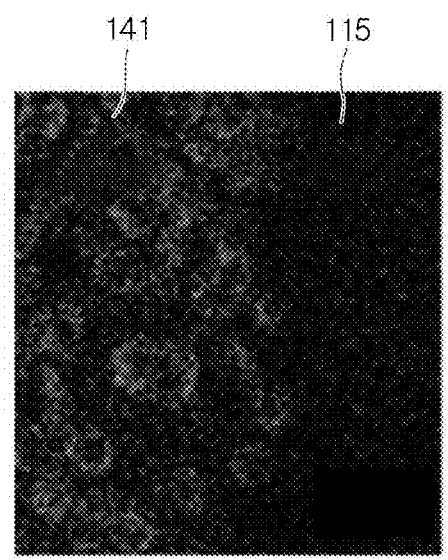
FIGS. 7 and 8 are images analyzed by TEM-EDS at an interface between an active region and a margin.
Figure 8:
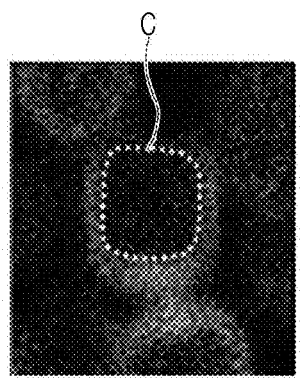

The TEM-EDS mapping images of FIGS. 7 and 8 are results of applying a core-shell structured powder doped with 3 mol % of Sn to 100 mol of Ba in the first cover region.

From FIGS. 7 and 8, it is possible to grasp the shape of the grains formed by sintering the Sn-doped powder and thus, to see a structural difference between the first cover region and the second cover region.

The method of analyzing the Sn content is as follows.

The sintered multilayer capacitor is thinned down to a ½ point of the Y-Z cross section in the X direction using FIB equipment, thereby preparing a thinned analysis sample. Then, a damaged layer on the surface of the flaked sample is removed using Ar ion milling.

Then, using STEM-EDX, mapping and quantitative analysis of Ba and Sn are performed on three dielectric layers located in the center of the WT cross section. The number of grains of the Sn-doped core-shell structure is checked in the mapping image, and the ratio of grains of the Sn-doped core-shell structure to the Sn-undoped grains is indicated.

In addition, the ratio of the Sn content to the Ba content is calculated and is expressed as the ratio of the Sn doped portion, in detail, the coverage.

Referring to FIGS. 7 and 8, in the grains of the core-shell structure doped with Sn in the first cover region (which will be described later in detail), the ratio of the Sn-doped portion within one grain is defined as coverage, and when one grain is analyzed, it is confirmed that the coverage becomes 30% or more.

If the coverage is less than 30% in the first cover region, the doping effect of Sn is reduced, and thus, similar to the use of general BT, grain growth is accompanied during sintering, and there may be a problem in which the degree of densification of the first cover region is deteriorated.

Unlike the margin portion in the capacitor body, if excessive abnormal grain growth occurs in the cover, the abnormal grain growth effect affects the active region, and a portion of the active region may not be properly sintered, resulting in a problem of low capacitance.

This problem may be prevented by changing the doping amount of Sn when the cover is stacked. As the doping amount of Sn increases, the abnormal grain growth effect of grains appears relatively strong during the sintering process. Therefore, after reducing the doping amount of Sn to 1 to 3 mol % to 100 mol of Ba in the first cover region, the occupancy rate of grains after sintering in the Sn-doped core-shell structure to the entirety of the first cover region is secured 20% or more, non-sintering problem in the active region due to the grain growth inhibitory effect that appears at the doping amount of 3 mol % more may be reduced. In one example, an occupancy rate of grains may refer to the number of grains having the Sn-doped core-shell structure, measured by for example STEM-EDX, in one region of the first cover region in a cross-section such as a length-thickness cross section cut at a center in a width direction or a width-thickness cross section cut at a center in a length direction to the total number of grains in the one region of the first cover region. These actions and principles are applied to the cover structure of the present embodiment.

Figure 12:
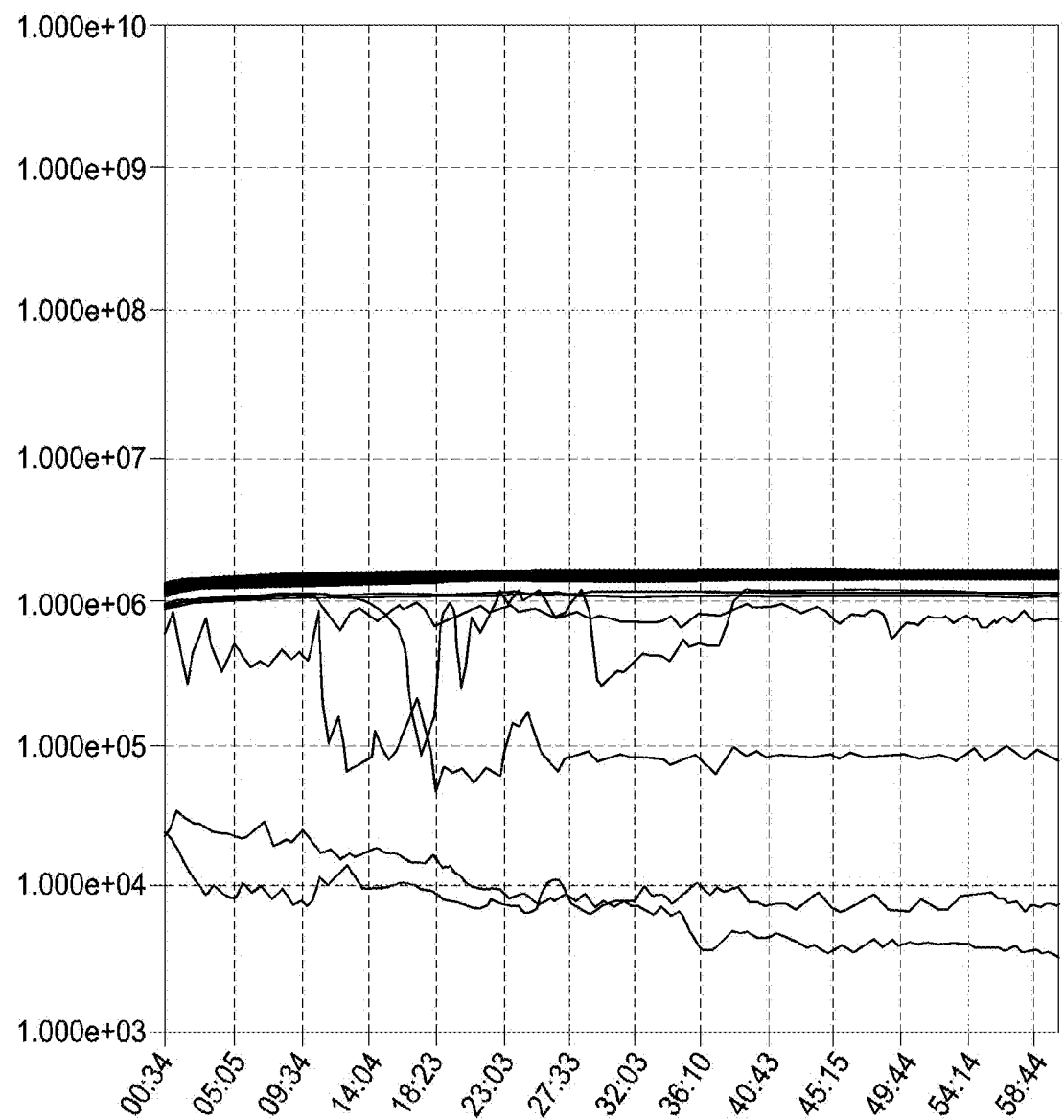
FIG. 12 is a graph illustrating moisture resistance when the ratio of grains of a core-shell structure doped with Sn to the total of the first cover region in the first cover region is 18%.

FIG. 12 is a graph illustrating moisture resistance when the ratio of grains of a core-shell structure doped with Sn to the total of the first cover region in the first cover region is 18%.

Figure 13:
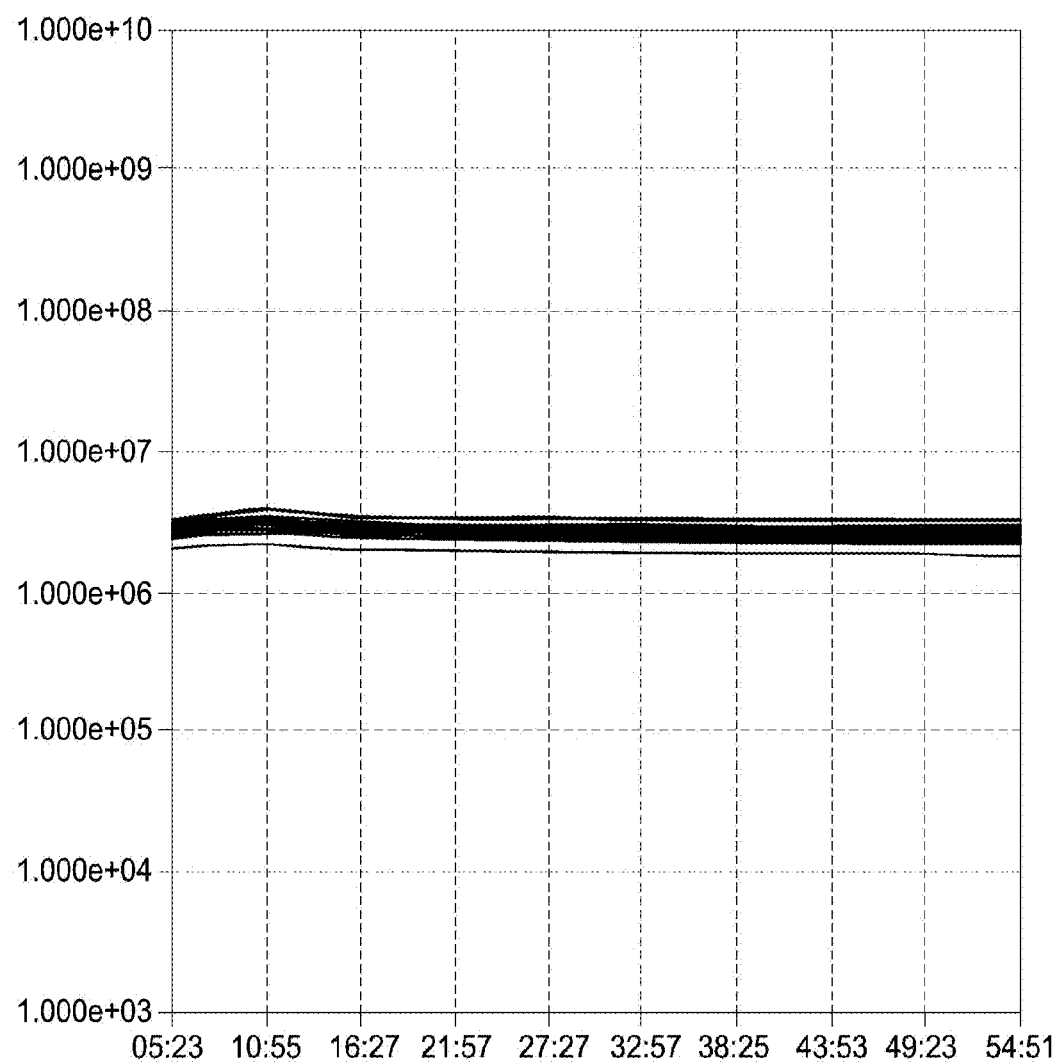
FIG. 13 is a graph illustrating moisture resistance when the ratio of grains of a core-shell structure doped with Sn to the total of the first cover region in the first cover region is 20%.

FIG. 13 is a graph illustrating moisture resistance when the ratio of grains of a core-shell structure doped with Sn to the total of the first cover region in the first cover region is 20%. The multilayer capacitors used in this experiment have a length×width of 0.4 mm×0.2 mm (production tolerance±0.1 mm), the number of stacked internal electrodes is 267, and a capacity is about 0.9 uF. This experiment is intended to measure insulation resistance (IR) using 20 such multilayer capacitors, and to determine the moisture resistance reliability of the multilayer capacitors thereby. In FIGS. 12 and 13, the X axis represents time, and the Y axis represents insulation resistance (Q). Referring to FIG. 12, some of the multilayer capacitors of the comparative example have a problem in that IR is lowered. In contrast, referring to FIG. 13, in the case of the multilayer capacitors according to an exemplary embodiment, since the grain size is relatively small and the density is improved, there is little change in IR. Therefore, it can be seen that the multilayer capacitors according to the exemplary embodiment have no problem in moisture resistance.

In the present embodiment, in the case of the upper and lower covers 140 and 150, portions thereof between the boundary surface of the active region 115 and the boundary surface of the capacitor body 110 are each divided into two, and portions of the two regions, adjacent to the active region 115, are defined as first cover regions 141 and 151, and portions adjacent to the boundary surface of the capacitor body 110 are defined as second cover regions 142 and 152.

Figure 4:
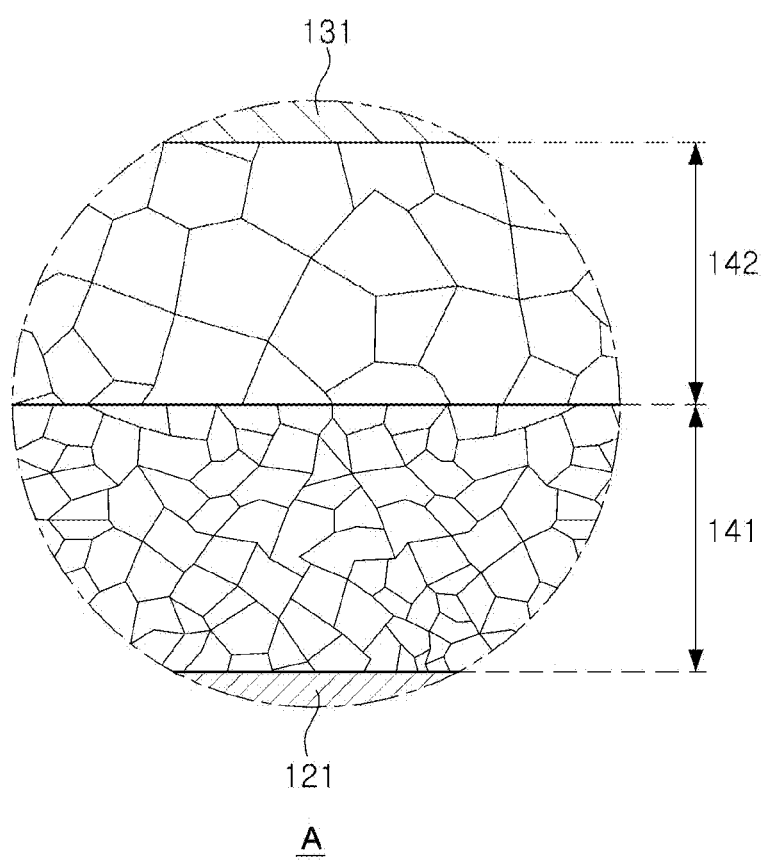
FIG. 4 is an enlarged view of region A of FIG. 1.

Region A of FIGS. 1 and 4 is an enlarged view of a portion of the upper cover 140, but the only difference is that the lower cover 150 is positioned on the first surface 1 side of the capacitor body 110, and since the configurations of the upper cover 140 and the lower cover 150 are similar, the description will be made based on the upper cover 140, but it is considered that this includes the description of the lower cover 150.

In the first cover region 141 adjacent to the boundary surface of the active region 115, 20% or more of the entire first cover region 141 may contain abnormal grain-growth grains.

The abnormal grain-growth grains have a Sn-doped core-shell structure in which a shell portion as a B-site is doped with Sn.

In addition, the second cover region 142 adjacent to the second surface 2 as the boundary surface of the capacitor body 110 includes grain growth-based grains that do not include Sn.

The molar ratio of Ba/Ti of the abnormal grain-growth grains included in the first cover region 141 is higher than that of general BT, and thus, the molar ratio of Ba/Ti of the first cover region 141 may be higher than the molar ratio of Ba/Ti of the active region 115.

In addition, the first cover region 141 may include 20% or more of Sn-doped core-shell structure grains to the total grains of the first cover region 141.

Figure 9:
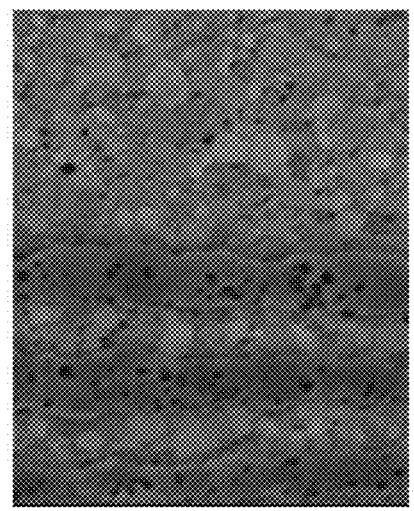
FIG. 9 is an enlarged SEM image illustrating a grain structure in a first cover region.
Figure 11:
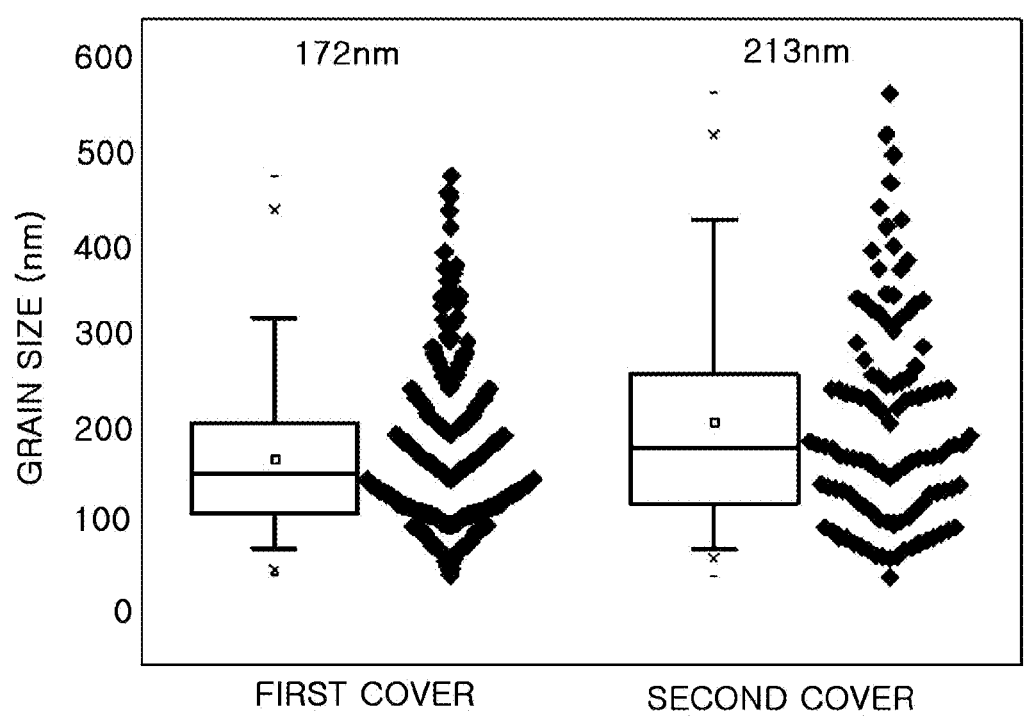
FIG. 11 is a graph illustrating grain sizes in a first cover region and a second cover region.

Accordingly, as can be seen in FIGS. 9 and 11, when the Sn-doped core-shell structure grain is applied, the grain size is relatively smaller and the density is improved compared to the general BT.

When a rapid temperature-rise firing condition is applied due to the recent miniaturization of the MLCC chip, relatively smaller grains may be formed, and overgrowth of grains included in the first cover region 141 is suppressed to reduce the grain size to 180 nm or less, in detail, 100 to 180 nm, and the degree of densification of the first cover region 141 may be increased compared to that of the second cover region 142. In one example, an average grain size of grains in the first cover region 141 may refer to an arithmetic average grain size of the grains in the first cover region 141, although the present disclosure is not limited thereto, and the average grain size of grains in the first cover region 141 may be 180 nm or less, in detail, 100 to 180 nm. For example, a scanning electron microscope (SEM) may be used to measure the average grain size. Other methods and/or tool appreciated by one of ordinary skill in the art, even if not described in the present disclosure, may also be used.

In this case, if the ratio of the grains of the Sn-doped core-shell structure in the first cover region 141 to the total of grains in the first cover region 141 is less than 20%, the abnormal grain growth effect of the Sn-doped core-shell structure powder is insignificant, and thus, there may be a problem in that grain growth of grains and relatively low densification characteristics appear as in the case of using a general BT-applied cover.

In addition, the thickness of the first cover region 141 may be 40 to 80% of the sum of the thicknesses of the first cover region 141 and the second cover region 142.

If the thickness of the first cover region 141 is less than 40%, the effect of densification and abnormal grain growth of the Sn-doped powder occurs insignificantly, and when it exceeds 80%, relatively small grains are formed due to abnormal grain growth of the Sn-doped powder and also affect the active region 115, and therefore, it may be difficult to implement capacitance due to abnormal grain growth of the active region 115.

Accordingly, when this ratio is satisfied, the first cover region 141 may significantly reduce the influence of firing behavior on the active region 115 at an appropriate firing temperature for implementing chip characteristics, and may further improve the degree of densification.

In the present embodiment, the second cover region 142 includes grain growth-based grains that do not include Sn, and does not include grains having a core-shell structure in which the shell portion is doped with Sn.

For example, the grains of the second cover region 142 may be formed of the same material as the grains included in the active region 115 instead of the first cover region 141.

Figure 10:
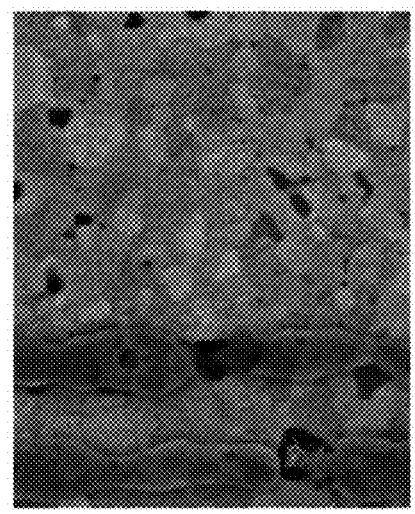
FIG. 10 is an enlarged SEM image illustrating a grain structure in a second cover region.

Accordingly, as illustrated in FIGS. 10 and 11, the size of the grains included in the second cover region 142 may be larger than the size of the grains of the first cover region 141, and in detail, may be 200 nm or more. In one example, an average grain size of grains in the second cover region 142 may refer to an arithmetic average grain size of the grains in the second cover region 142, although the present disclosure is not limited thereto, and the average grain size of grains in the second cover region 141 may be 200 nm or more, and be larger than the average grain size of the first cover region 141.

In the related art, the density of the cover is secured by adjusting the molar ratio of Ba/Ti in the composition constituting the cover.

In detail, a capacitor body is formed, by stacking a cover having a Ba/Ti ratio capable of ensuring densification at a sintering temperature that implements an appropriate capacitance of the multilayer capacitor, on upper and lower portions of the active region.

In this case, since the cover is formed by controlling only the number of stacked dielectric layers with a single base material, it is difficult to control the sintering behavior according to the position of the cover.

Therefore, from the inside to the outside, the grain size may decrease and the degree of densification may be lowered. Accordingly, the degree of densification may be secured in the inner portion of the cover, but the degree of densification is significantly lowered in the outer portion of the cover, resulting in being vulnerable to moisture resistance.

However, if only the densification degree is secured by lowering the Ba/Ti ratio to improve the densification degree of the cover, the cover may be over-contracted as compared to the active region due to over-sintering, and thus, there may be a problem in which chip shape deformation or overgrowth of grains in the active region occurs.

In this case, electrode aggregation or degradation of breakdown voltage (BDV) may occur due to overgrown grains.

In the present embodiment, after the first cover region 141 is first formed on the active region 115, the second cover region 142 is formed on the first cover region 141, and the second cover region is formed of a material having a relatively higher driving force for sintering, compared to that of the cover region, thereby reducing the frequency of occurrence of pores in the outer portion of the cover 140.

In addition, since a base material having a size smaller than that of the dielectric base material used in the first cover region 141 is applied to the second cover region 142 to increase the grain growth driving force, the second cover region serving as the outer portion of the cover 140 has a degree of densification lower than that of the first cover region 141, and properties such as toughness and hardness may be improved instead.

Accordingly, the reliability of the multilayer capacitor 100 may be improved and the crack occurrence rate may be reduced.

Figure 5:
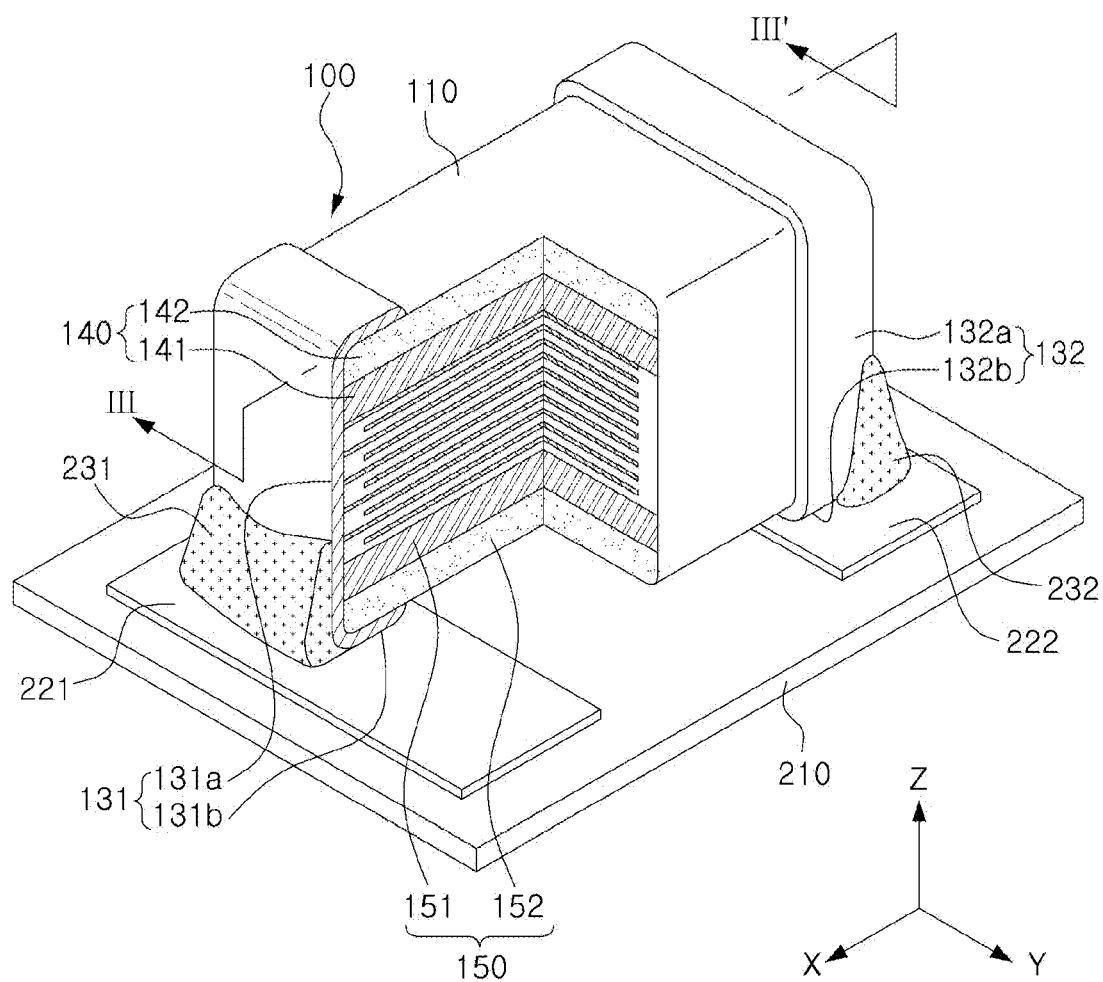
FIG. 5 is a perspective view schematically illustrating a board on which a multilayer capacitor is mounted according to an exemplary embodiment, and is a view illustrating a portion of the multilayer capacitor cut off.
Figure 6:
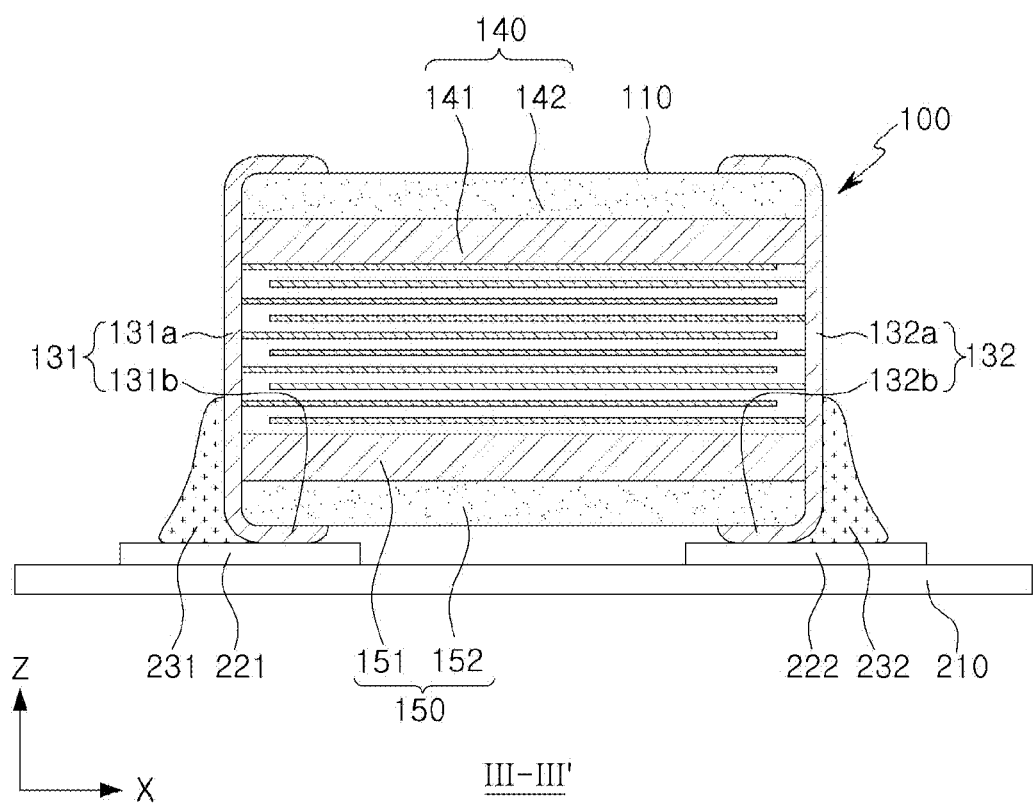
FIG. 6 is a cross-sectional view taken along line of FIG. 5.

FIG. 5 is a perspective view schematically illustrating a board on which a multilayer capacitor is mounted according to an embodiment, and is a partial cutaway view of the multilayer capacitor, and FIG. 6 is a cross-sectional view taken along line III-III' of FIG. 5.

Referring to FIGS. 5 and 6, the board on which the multilayer capacitor is mounted according to the present embodiment includes the multilayer capacitor 100, and a substrate 210 on which the multilayer capacitor 100 is mounted.

In this case, the multilayer capacitor 100 is a multilayer capacitor according to an embodiment of the present disclosure, and a detailed description thereof will be omitted to avoid duplication.

The substrate 210 includes first and second electrode pads 221 and 222 formed on the upper surface of the substrate 210.

The first and second electrode pads 221 and 222 may be connected to the first and second external electrodes 131 and 132 of the multilayer capacitor 110, respectively.

For example, in a state in which the first external electrode 131 and the second external electrode 132 of the multilayer capacitor 100 are positioned to be in contact with the first electrode pad 221 and the second electrode pad 222, respectively, the first external electrode 131 and the second external electrode 132 may be mounted on the substrate 210 by solders 231 and 232.

As set forth above, according to an embodiment, in the cover of the capacitor body, the inner first cover region may have a relatively high degree of densification without affecting the implementation of chip characteristics, and the outer second cover region is configured to induce grain growth, thereby securing characteristics such as toughness and hardness of the multilayer capacitor at a certain level or higher.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed to have a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A multilayer capacitor comprising:
   a capacitor body including an active region having dielectric layers and internal electrodes alternately stacked therein, the capacitor body including upper and lower covers disposed on upper and lower surfaces of the active region, respectively; and
   an external electrode disposed on an external surface of the capacitor body,
   wherein in one of the upper and lower covers, a portion thereof between a boundary surface of the active region and a boundary surface of the capacitor body is divided into a first cover region adjacent to the active region and a second cover region adjacent to the boundary surface of the capacitor body, and the first cover region includes grains having a core-shell structure doped with Sn, and
   the first cover region includes 20% or more of Sn-doped core-shell structure grains, compared to the total of grains in the first cover region.

2. The multilayer capacitor of claim 1, wherein in the grains of the core-shell structure doped with Sn, a ratio of Sn-doped portions in one grain is referred to as coverage, and the coverage is 30% or more.

3. The multilayer capacitor of claim 1, wherein grains included in the second cover region do not include Sn.

4. The multilayer capacitor of claim 1, wherein a size of grains of the second cover region is greater than a size of grains of the first cover region.

5. The multilayer capacitor of claim 1, wherein a thickness of the first cover region is 40 to 80% of a sum of thicknesses of the first cover region and the second cover region.

6. The multilayer capacitor of claim 1, wherein a grain size of the second cover region is greater than a grain size of the first cover region, and
   a thickness of the first cover region is 40 to 80% of a sum of thicknesses of the first cover region and the second cover region.

7. The multilayer capacitor of claim 1, wherein a grain size of the first cover region is 100 to 180 nm.

8. The multilayer capacitor of claim 1, wherein a grain size of the second cover region is 200 nm or more.

9. The multilayer capacitor of claim 1, wherein a grain size of the first cover region is 100 to 180 nm, and a grain size of the second cover region is 200 nm or more.

10. The multilayer capacitor of claim 1, wherein the grains of the first cover region have a higher molar ratio of Ba/Ti than a molar ratio of grains of the active region.

11. The multilayer capacitor of claim 1, wherein a grain of the second cover region is the same material as a material of a grain of the active region.

12. The multilayer capacitor of claim 1, wherein an average size of grains of the second cover region is greater than an average grain size of grains of the first cover region.

13. The multilayer capacitor of claim 1, wherein an average grain size of the first cover region is 100 to 180 nm.

14. The multilayer capacitor of claim 1, wherein an average grain size of the second cover region is 200 nm or more.

15. The multilayer capacitor of claim 1, wherein an average grain size of the first cover region is 100 to 180 nm, and
    an average grain size of the second cover region is 200 nm or more.

16. A board having a multilayer capacitor mounted thereon, the board comprising:
    a substrate having a plurality of electrode pads disposed on an upper surface; and
    the multilayer capacitor installed on the substrate in such a manner that an external electrode is mounted on a pad,
    wherein the multilayer capacitor includes:
       a capacitor body including an active region having dielectric layers and internal electrodes alternately stacked therein, the capacitor body including upper and lower covers disposed on upper and lower surfaces of the active region, respectively; and
       an external electrode disposed on an external surface of the capacitor body,
       in one of the upper and lower covers, a portion thereof between a boundary surface of the active region and a boundary surface of the capacitor body includes two regions, and among two regions, a first cover region adjacent to the active region includes grains having a core-shell structure doped with Sn, and
       the first cover region includes 20% or more of Sn-doped core-shell structure grains compared to the total of grains in the first cover region.

17. The board of claim 16, where among the two regions, a second cover region adjacent to the boundary surface of the capacitor body includes grains that does not include Sn.

18. A multilayer capacitor comprising:
    a capacitor body including an active region having dielectric layers and internal electrodes alternately stacked therein, the capacitor body including upper and lower covers disposed on upper and lower surfaces of the active region, respectively; and
    an external electrode disposed on an external surface of the capacitor body,
    wherein one of the upper and lower covers includes a first region adjacent to the active region and a second region adjacent to the boundary surface of the capacitor body,
    the first region includes grains having a core-shell structure doped with more Sn than grains in the second region, and an average size of the grains of the second region is greater than an average grain size of the grains of the first region.

19. The multilayer capacitor of claim 18, wherein the grains included in the second region do not include Sn.

20. The multilayer capacitor of claim 18, wherein the grains of the first region have a higher molar ratio of Ba/Ti than a molar ratio of grains of the active region.

21. The multilayer capacitor of claim 18, wherein a grain of the second region is the same material as a material of a grain of the active region.

22. The multilayer capacitor of claim 18, wherein an average grain size of the first region is 100 to 180 nm, and an average grain size of the second region is 200 nm or more.

* * * * *